United States Patent
Shen et al.

(10) Patent No.: US 9,373,535 B2
(45) Date of Patent: Jun. 21, 2016

(54) T-SHAPED FIN ISOLATION REGION AND METHODS OF FABRICATION

(71) Applicant: GLOBALFOUNDRIES Inc., Grand Cayman (KY)

(72) Inventors: Hongliang Shen, Ballston Lake, NY (US); Zhenyu Hu, Clifton Park, NY (US); Jin Ping Liu, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1 day.

(21) Appl. No.: 14/515,628

(22) Filed: Oct. 16, 2014

(65) Prior Publication Data

US 2016/0111320 A1    Apr. 21, 2016

(51) Int. Cl.
*H01L 21/62* (2006.01)
*H01L 21/762* (2006.01)
*H01L 27/088* (2006.01)
*H01L 29/06* (2006.01)
*H01L 21/8234* (2006.01)
*H01L 21/311* (2006.01)
*H01L 29/66* (2006.01)

(52) U.S. Cl.
CPC .... *H01L 21/76232* (2013.01); *H01L 21/31144* (2013.01); *H01L 21/823431* (2013.01); *H01L 21/823437* (2013.01); *H01L 21/823481* (2013.01); *H01L 27/0886* (2013.01); *H01L 29/0649* (2013.01); *H01L 29/6681* (2013.01)

(58) Field of Classification Search
CPC ................. H01L 21/76232; H01L 21/311444; H01L 21/823431
USPC .......................................................... 438/254
See application file for complete search history.

(56) References Cited

U.S. PATENT DOCUMENTS

| | | | |
|---|---|---|---|
| 8,609,510 B1 | 12/2013 | Banna et al. | |
| 2015/0243659 A1* | 8/2015 | Huang ................ | H01L 27/0886 257/401 |
| 2015/0348845 A1* | 12/2015 | Lin .................. | H01L 21/823431 438/595 |

* cited by examiner

*Primary Examiner* — Matthew W Such
*Assistant Examiner* — Warren H Kilpatrick
(74) *Attorney, Agent, or Firm* — Heslin Rothenberg Farley and Mesiti PC; Nicholas Mesiti (57) ABSTRACT

Semiconductor devices and fabrication methods are provided having an isolation feature within a fin structure which, for instance, facilitates isolating circuit elements supported by the fin structure. The fabrication method includes, for instance, providing an isolation material disposed, in part, within the fin structure, the isolation material being formed to include a T-shaped isolation region and a first portion extending into the fin structure, and a second portion disposed over the first portion and extending above the fin structure.

19 Claims, 6 Drawing Sheets

T-SHAPED FIN ISOLATION REGION AND METHODS OF FABRICATION

BACKGROUND

Semiconductor devices, such as integrated circuits, are typically fabricated in large batches from a semiconductor wafer. The semiconductor wafer is then diced into individual dies, or microchips, which are subsequently packaged. As is known, density of integrated circuit components continues to increase to achieve ever greater device functionality within a given footprint and reduced manufacturing costs. This desire for large scale integration has led to a continued shrinking of circuit dimensions and component features. The ability to reduce size of component features is driven, at least in part, by performance enhancements in manufacturing processes by which the circuit structures are formed on a wafer.

BRIEF SUMMARY

Certain shortcomings of existing art are overcome and additional advantages are provided through the provision, in one aspect, of a method which includes providing an isolation feature within a fin structure. The providing includes: providing an isolation material disposed, in part, within the fin structure, the isolation material being formed to include a T-shaped isolation region and including a first portion extending into the fin structure, and a second portion disposed over the first portion and extending above the fin structure.

In a further aspect, a semiconductor device is provided which includes: a substrate with a fin structure extending above the substrate; a first circuit element and a second circuit element supported by the fin structure; and a T-shaped isolation region disposed partially within the fin structure and separating the first and second circuit elements, the T-shaped isolation region including a first portion extending into the fin structure, and a second portion disposed over the first portion and extending above the fin structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Further, note that, in making reference below to the drawings (which are not drawn to scale for ease of understanding) the same reference numbers used through-out different figures designate the same or similar components.

Disclosed herein, in part, are methods of fabricating a semiconductor device having an isolation feature within a fin structure which, for instance, facilitates isolating circuit elements associated with the fin structure. As discussed above, in fabricating integrated circuit (ICs), the desire for reduced component size features and circuit dimensions has lead to significant challenges using existing fabricating techniques, including isolation of circuit features being formed on a wafer.

Figure 1:
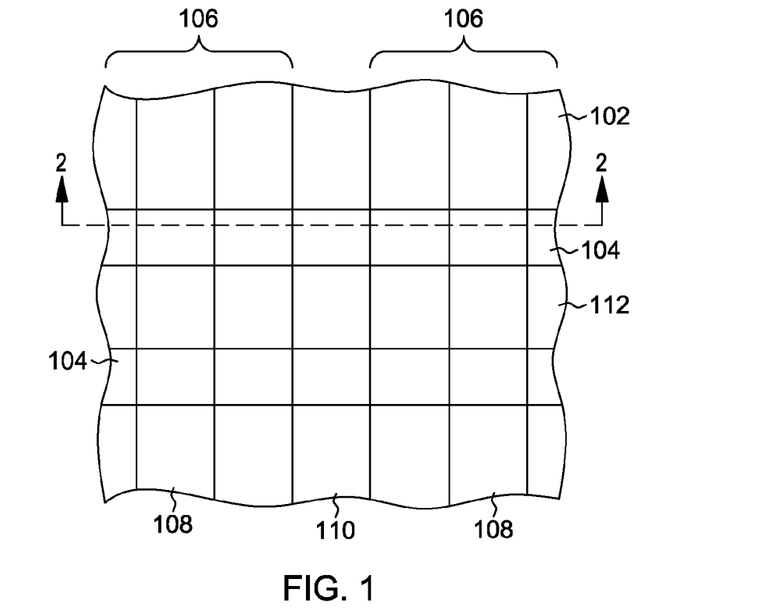
FIG. 1 depicts a plan-view of one embodiment of a semiconductor device obtained during a semiconductor fabrication process to be modified, in accordance with one or more aspects of the present invention.

FIG. 1 depicts one embodiment of a semiconductor device, generally denoted 100, obtained during a semiconductor fabrication process. By way of overall context, in one example, substrate 102 may include one or more fin structures 104 which support the formation of fin-type field-effect transistors (FinFETs). The fin structures or fin(s) 104 may be used to form circuit elements 106 having gate structures 108 extending conformally over (and partially wrapping around the one or more fins) and active regions such as, for instance, source and drain regions, and channel regions separated by the source and drain regions. Note that, in one embodiment, circuit elements 106 associated with fin(s) 104, may be isolated from one another by an isolation region (not shown) disposed within the fin(s), with a sacrificial gate structure 110 over the isolation region. By way of example, sacrificial gate structure 110 of an appropriate material, such as, polycrystalline silicon (polysilicon) may extend conformally over (and partially wrapping around) the one or more fins, resulting in creating a diffusion break between circuit elements associated with the fin(s). Further, the space between the fin(s) 104 may be filled with an isolation material 112, so as to laterally isolate the fin(s) and the circuit elements formed therein from one another.

Figure 2:
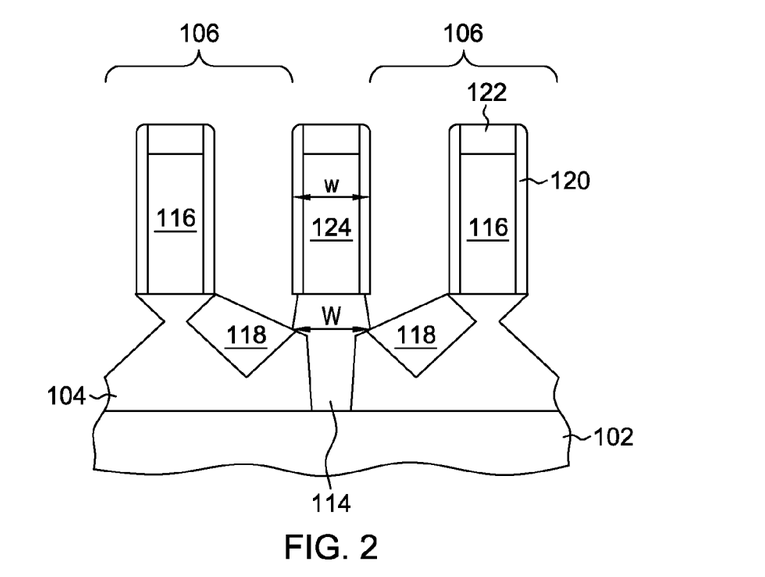
FIG. 2 is a partial cross-sectional elevation view of a structure of FIG. 1, taken along line 2-2 thereof, illustrating one or more circuit elements associated with a fin structure, and isolated from one another with a T-shaped isolation region disposed within the fin structure to be modified.

FIG. 2 illustrates the structure of FIG. 1, taken along line 2-2 thereof, and depicts circuit elements 106 supported by fin(s) 104, and isolated from one another with a T-shaped isolation region 114 disposed within fin(s) 104. In one embodiment, circuit elements 106 may include gate structures 116 extending conformally over (and partially wrapping around) fin(s) 104. In one example, a replacement gate process may be employed where a sacrificial gate of an appropriate material, such as polycrystalline silicon (or polysilicon), may be provided at an early stage of circuit fabrication, and then later removed and replaced with a final gate structure. In another example, the gate structure may be formed directly without the use of a sacrificial gate. In either gate process, the gate structure(s) may be formed either before (gate-first) or after (gate-last) the formation of source and drain regions (referred to herein as active regions 118) of the field-effect transistors, depending upon the process flow selected. Additionally, the gate structures 116 may optionally be provided with sidewall spacers 120 disposed along the sidewalls of the gate structure(s) and gate caps 122 over the gate structure(s). By way of example, sidewall spacers 120 and gate caps 122 may include or be fabricated of a nitride material such as, for example, silicon nitride (SiN). Further, active regions 118 may be formed using any suitable techniques including, for example, ion implantation, epitaxial growth of embedded source/drain materials and activation anneals, etc.

Note that, in the depicted embodiment, the isolation region 114 is T-shaped in elevational cross-section, and that the horizontal portion of the T-shaped isolation region extends laterally outward over the vertical portion of the isolation region. Although as depicted, the isolation region 114 is T-shaped in elevational cross-section, the isolation region may also be formed in other conventional shapes, depending upon the process parameters employed during its fabrication. In the depicted example, isolation region 114 is fully embedded within fin(s) 104, with the horizontal portion of the T-shaped isolation region being disposed below an upper surface of fin(s). Several issues may arise, for instance, due to the T-shaped isolation region being disposed within the fin(s), and in particular, due to an asymmetrical epitaxially growth of active regions 118. This, in turn, could result in performance degradation of the resultant semiconductor device(s). For instance, it may be desirable to dispose a sacrificial gate structure 124 of an appropriate material, such as polycrystalline silicon (polysilicon) or amorphous silicon (a-Si), over the T-shaped isolation region to create a diffusion break between circuit elements associated with the fin(s). Additionally, this sacrificial gate structure disposed over the T-shaped isolation region may have a width "w" greater than a width "W" of the underlying T-shaped isolation region which, for instance, may result in undesirable electrical shorting between the circuit elements of the fin(s). Further, the T-shaped isolation region disposed within the fin(s) could also contribute to structural defects, which could also result in additional performance degradation of the resultant semiconductor device(s). For instance, during the forming of the T-shaped isolation region, the silicon fin material disposed adjacent to the T-isolation region may also be inadvertently recessed. This undesirable recessing of the fin material, for instance, could often result in non-uniform epitaxial growth of embedded source/drain materials which, in turn, could adversely affect the circuit performance, for instance, by decreasing the mobility of charge carriers of the resultant device(s).

To address these issues, disclosed herein, in one aspect, is a novel method of providing an isolation feature within a fin structure which, for instance, facilitates isolating circuit elements associated with the fin structure. The method includes, for instance, providing an isolation material disposed, in part, within the fin structure, the isolation material being formed to include a T-shaped isolation region and including a first vertical portion extending into the fin structure, and a second horizontal portion disposed over the first portion, above the fin structure.

By way of example, a depth "D" of the first portion of the T-shaped isolation region extending into the fin structure may be greater than a width "W" of the second portion of the T-shaped isolation region extending above the fin structure. In another example, the second portion of the T-shaped isolation region may reside fully above the fin structure. The first portion of the T-shaped isolation region tapers into the fin structure, and an upper surface of the first portion has a width smaller than a width "W" of the second portion of the T-shaped isolation region extending above the fin structure.

In one embodiment, the providing the isolation material includes disposing the isolation material within and adjacent to at least one sidewall of the fin structure, and the method further including providing a layer of masking material over the isolation material, and selectively etching through the layer of masking material to define a protective mask, the protective mask facilitating defining the second portion of the T-shaped isolation region. The method further includes recessing, at least in part, the isolation material adjacent to the at least one sidewall of the fin structure down from an upper surface of the fin structure, with the recessing of the isolation material also partially undercutting the protective mask to reduce a width "W" of the second portion of the T-shaped isolation region. For instance, the recessing of the isolation material may employ an etching process to partially undercut the protective mask, the etching process being selected to facilitate controlling the width "W" of the second portion of the T-shaped isolation region underlying the protective mask. In one example, the etching process may be at least one of an anisotropic etch process or an isotropic etch process.

The protective mask disposed over the isolation material may include or be fabricated of, for instance, a nitride material such as, for example, silicon nitride (SiN or $Si_xN_y$). By way of example, the protective mask may be or include a first material such as, for instance, a nitride material (for instance, silicon nitride (SiN)) and the isolation material may be or include a second material such as, for instance, an oxide material (for instance, silicon oxide ($SiO_2$), high-aspect-ratio process silicon oxide (HARP oxide), high-density plasma silicon oxide (HDP-$SiO_2$)). Note that the first material and the second material may include or be different materials.

In one aspect, the fabricating method may further include fabricating, subsequent to the providing of the T-shaped isolation region, a first circuit element and a second circuit element in association with the fin structure. In such an implementation, the T-shaped isolation region disposed partially within the fin structure facilitates isolating the first and second circuit elements. Further, the method may also include providing a sacrificial gate structure disposed over the T-shaped isolation region. By way of example, a width "w" of the sacrificial gate structure disposed over the T-shaped isolation region is smaller than a width "W" of the second portion of the T-shaped isolation region.

In another aspect, a semiconductor device is disclosed which includes a substrate with a fin structure associated with the substrate; a first circuit element and a second circuit element supported by the fin structure; and a T-shaped isolation region disposed partially within the fin structure and separating the first and second circuit elements, with the T-shaped isolation region including a first portion extending into the fin structure, and a second portion disposed over the first portion and extending above the fin structure.

By way of example, FIGS. 3A-3M depict one detailed embodiment of a method of fabricating a semiconductor device having an isolation feature within a fin structure which, for instance, facilitates isolating circuit elements associated with the fin structure, in accordance with one or more aspects of the present invention.

Figure 3A:
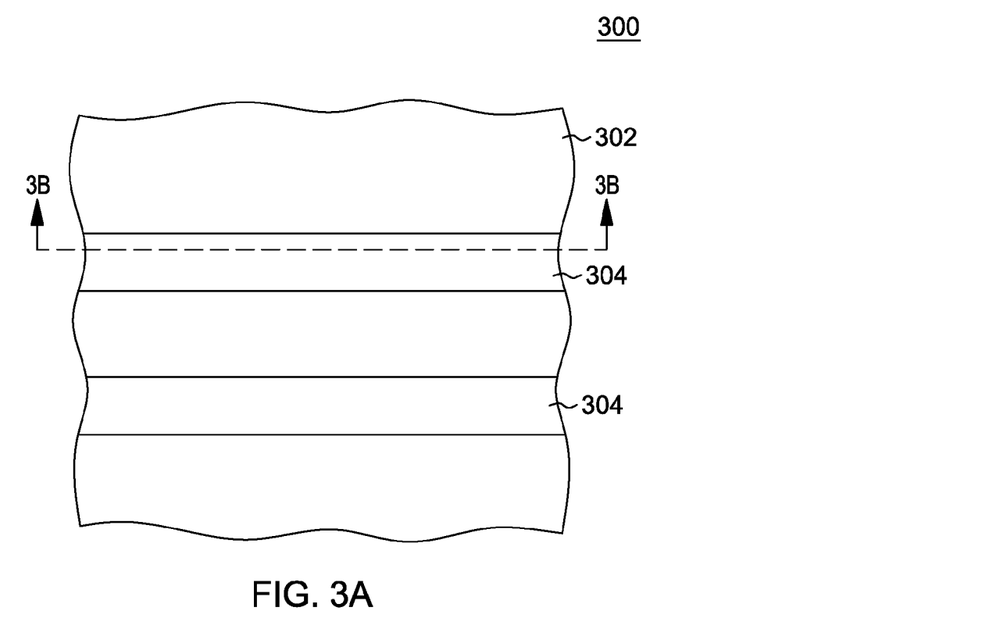
FIG. 3A depicts a plan-view of one embodiment of an intermediate structure obtained during fabrication of a semiconductor device, in accordance with one or more aspects of the present invention.

FIG. 3A depicts a plan-view of one embodiment of an intermediate structure 300 obtained during fabrication of a semiconductor device, in accordance with one or more aspects of the present invention. As depicted, in one example, semiconductor structure 300 may include a substrate 302 and one or more fin structure(s) or fin(s) 304, supporting the formation of fin-type field-effect transistors (FinFETs).

Figure 3B:
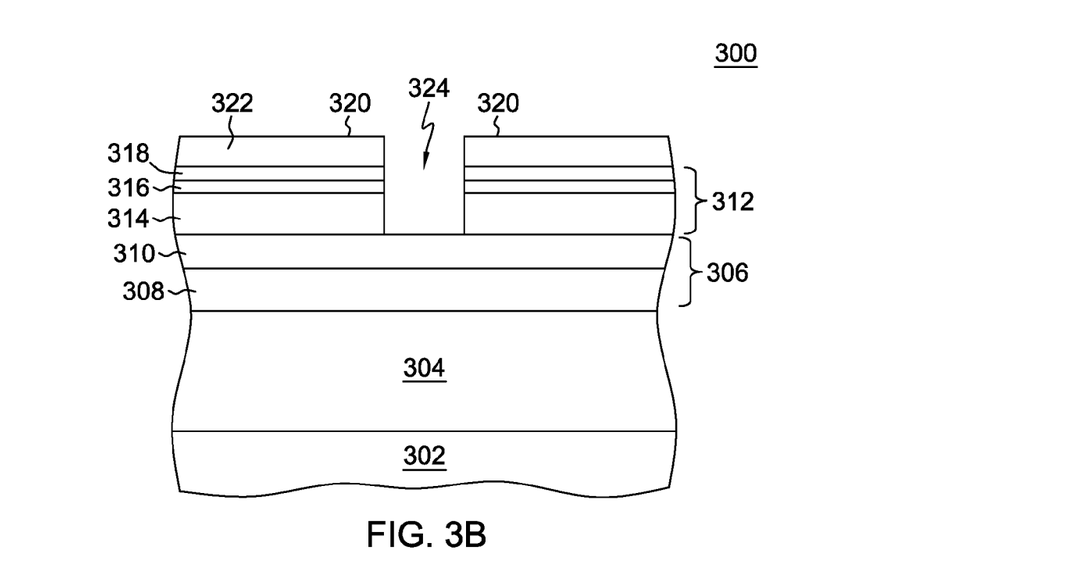
FIG. 3B depicts a partial cross-sectional elevational view of the structure of FIG. 3A, taken along line 3B-3B thereof, in accordance with one or more aspects of the present invention

FIG. 3B illustrates a partial cross-sectional elevational view of the structure of FIG. 3A, taken along line 3B-3B thereof. By way of example, in one embodiment, substrate 302 may be a bulk semiconductor material such as a bulk silicon wafer. As another example, substrate 302 may include or be a silicon-containing substrate including, but not limited to, silicon (Si), single crystal Si, polycrystalline Si, amorphous Si, silicon-on-nothing (SON), silicon-on-insulator (SOI), or silicon-on-replacement insulator (SRI) substrate or the like. Substrate 302 may in addition or instead include various isolations, dopings and/or device features. For instance, substrate 302 may include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb).

Continuing with FIG. 3B, fin structure(s) or fin(s) 304 may extend from substrate 302. By way of example, fin(s) may be formed by removing one or more portions of the substrate to create the fin(s) from the same material as the substrate such as, for example, a semiconductor or crystalline silicon material. In one example, formation of fin(s) may be achieved by patterning the substrate using any of various approaches, including: direct lithography; sidewall image transfer technique; extreme ultraviolet lithography (EUV); e-beam technique; litho-etch litho-etch; or litho-etch litho-freeze. Following patterning, material removal may be performed, for example, by any suitable etching process, such as an anisotropic dry etching process, for instance, reactive-ion-etching (RIE) in sulfur hexafluoride ($SF_6$). In another example, the fin(s) may be formed on the substrate, and the fins and the substrate may be different materials.

One or more protective substrate layers 306 may be disposed over fin(s) 304 and may include, for instance, first protective substrate layer 308 disposed over fin(s) 304 and second protective substrate layer 310 disposed over first protective substrate layer 308. First protective substrate layer 308, which may be deposited using conventional deposition processes such as chemical vapor deposition (CVD), physical vapor deposition (PVD) or atomic layer deposition (ALD), may be provided to protect silicon fin material 304 from damage during subsequent etching processes, and depending on the fabrication process, may also prevent fin(s) 304 from being oxidized by exposure to any oxygen-containing environment. In one specific example, first protective substrate layer 308 may include a nitride material, such as silicon nitride ($Si_3N_4$ or SiN), or silicon oxynitride (SiN). In one embodiment, a first protective substrate layer 308 may have a thickness suitable to act as an etch stop layer to protect fin(s) 304 from damage, however the thickness of first protective substrate layer 308 may vary according to the processing node in which the semiconductor device is being fabricated.

First protective substrate layer 308 may itself be protected by second protective substrate layer 310, which may be formed of a variety of materials. By way of specific example, second protective substrate layer 310 may be a layer of oxide material such as, for example, silicon dioxide ($SiO_2$) having a conventional thickness, and may be formed via a chemical-vapor deposition process.

Structure 300 may further include one or more protective layer(s) 312 disposed over protective substrate layer(s) 306. By way of example, protective layer(s) 312 may be used, in part, to support patterning and forming of opening(s) in the underlying fin structure(s) 304. Protective layer(s) 312 may include, for instance, a first hard-mask layer 314 and a second hard-mask layer 316 disposed over first hard-mask layer 314. The deposition process may include any conventional process such as, for example, low temperature CVD, plasma-enhanced CVD or atomic layer deposition (ALD). In one example, the first hard-mask layer 314 may include or be fabricated of one or more layers of carbon-containing materials such as, for instance, silicon oxycarbide ($Si_xO_yC_z$), amorphous carbon (a-C) or graphite. In another example, the second hard-mask layer 316 may also include or be fabricated of silicon-containing materials such as, for instance, silicon oxide ($Si_xO_y$), silicon nitride ($Si_xN_y$), silicon oxynitride ($Si_xO_yN_z$), tetraethyl orthosilicate (TEOS) or octamethylcyclotetrasiloxane (OMCTS) layer.

One or more lithographic processing steps may be performed to pattern opening(s) within the one or more protective layer(s) 312. These lithographic processing steps may include, for instance, providing a lithographic stack in which, an anti-reflective coating 318 is disposed over protective layer(s) 312, and a mask pattern 320 is disposed over anti-reflective coating layer 318. Note that, in one embodiment, mask pattern 320 includes patterned photoresist layer 322 and opening(s) 324. Anti-reflective coating 318 may be, for instance, a bottom anti-reflective coating (BARC) layer deposited over protective layer(s) 312 to minimize any pattern distortion due to reflections. In one example, anti-reflective coating 318 includes conventional inorganic coating materials such as titanium, titanium dioxide, titanium nitride, chromium oxide, carbon or a-silicon. In another example, anti-reflective coating 318 may also include a conventional organic coating material, such as light-adsorbent material, or a polymeric material or combinations thereof. In yet another example, anti-reflective coating 318 may also include or be fabricated of a silicon anti-reflective coating layer (Si-ARC) which, for instance, may include materials having silicon and nitrogen, silicon and oxygen, or silicon, oxygen and nitrogen, or an organic polymer or combinations thereof. Mask pattern 320 may include or be fabricated of a conventional photoresist material. As is known, photoresist layer 322 protects underlying layers in the direction of etching during the etch processing, while the etching proceeds through the openings 324. Mask pattern 320 may include, for instance, organic photoresist material, non-organic materials, or combinations thereof.

One or more lithographic processes are performed to transfer the pattern from the mask pattern 320 to protective layer(s) 312. By way of example, these one or more processes may include an anti-reflective coating open step and a hard-mask open step. A final etch step is performed to obtain the structure depicted in FIG. 3C, in which the mask pattern 320, anti-reflective coating layer 318 and one or more protective layer(s) 312 have been removed, leaving opening(s) 324 within one or more protective substrate layer(s) 306.

Figure 3C:
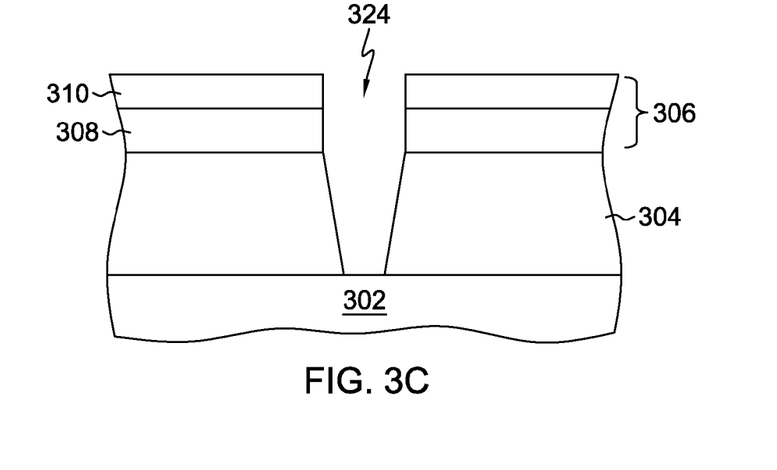
FIG. 3C depicts the structure of FIG. 3B, after forming an opening within a fin structure extending above a substrate thereof, in accordance with one or more aspects of the present invention.

Continuing with FIG. 3C, in one embodiment, opening(s) 324 disposed within one or more protective substrate layer(s) 306 may extend through fin(s) 304 to substrate 302. In one example, fin(s) 304 may be patterned using various approaches, including direct lithography, sidewall image transfer techniques, extreme ultraviolet lithography (EUV), e-beam techniques, litho-etch litho-etch technique, or litho-etch litho-freeze technique. Following patterning, silicon fin material may be removed to form an opening 324. Removal may be accomplished using any suitable removal process, such as an etching process with an etchant selective to, for instance, the materials of protective substrate layer 310 and protective substrate layer 308. In one example, etching may be anisotropic etching, such as reactive ion etching (RIE), using an appropriate chemistry, depending on the material of the layers being etched. In a specific example, the reactive ion etching may be performed using fluorine-based chemistry and gases such as tetrafluoromethane ($CF_4$), trifluoromethane ($CHF_3$), difluoromethane ($CH_2F_2$), fluoromethane ($CH_3F$), octofluoromethane ($C_4F_8$), hexafluoro-1,3,-butadiene ($C_4F_6$), sulfur hexafluoride ($SF_6$), oxygen ($O_2$) and the like.

Figure 3D:
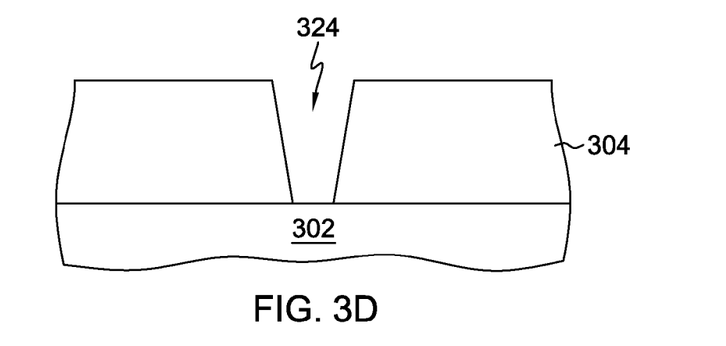
FIG. 3D depicts the structure of FIG. 3C after removing one or more upper layers disposed above the fin structure, in accordance with one or more aspects of the present invention.

FIG. 3D illustrates the structure of FIG. 3C, after removing one or more protective substrate layer(s) 306 disposed over fin(s) 304. The protective substrate layer(s) 306 may be removed using any suitable etching process. For example, second protective substrate layer 310 which, in one example, may be or include oxide layer, may be removed using hydroxide containing chemical wet etchants such as, for example, tetraethylammonium hydroxide (TMAH) or ammonium hydroxide ($NH_4OH$), and the underlying first protective substrate layer 308 which, in one example, may be or include a nitride layer, may be removed using hot phosphorus process.

Figure 3E:
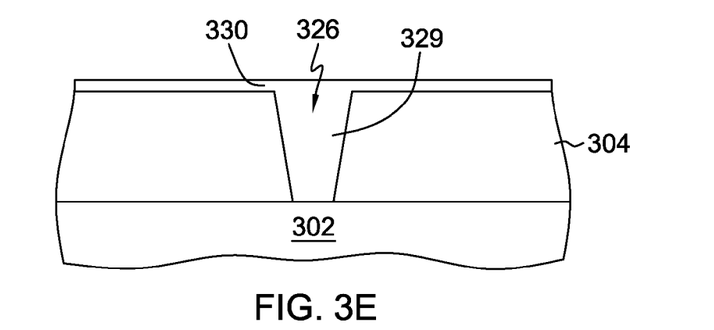
FIG. 3E depicts the structure of FIG. 3D with an isolation material having been disposed within the opening in the fin structure and adjacent to at least one sidewall of the fin structure, in accordance with one or more aspects of the present invention.

FIG. 3E illustrates the structure of FIG. 3D after providing an isolation material 326 within opening 324 (FIG. 3C) of fin(s) 304 and extending (in one embodiment) over and between the fins. Note that, in this embodiment, isolation material 326 is disposed within the opening of the fin(s), with a vertical portion 329 of the isolation material extending into fin(s) 304 and a horizontal portion 330 of the isolation material extending laterally outward over vertical portion 329 and over fin(s) 304. Isolation material 326 may be deposited using a variety of techniques such as, for example, chemical vapor deposition (CVD), plasma-enhanced CVD, or sub-atmospheric pressure thermal CVD (SACVD) processes and the thickness may be (in one example) sufficient to allow for subsequent planarization of the structure. By way of example, isolation material 326 may be fabricated of or include an oxide material. For instance, high-density plasma (HDP) oxide, high aspect ratio process (HARP)-oxide, tetraethyl orthosilicate (TEOS)-based silicon dioxide, or undoped silicon oxide (UDOX) may be deposited as isolation material 326, using plasma-enhanced CVD process. In a specific example, the chemical vapor deposition process may be employed using tetraethyl orthosilicate (TEOS) and ozone ($O_3$) as reactants to deposit the tetraethyl orthosilicate based silicon dioxide as an isolation material 326 within fin(s) 304.

Figure 3F:
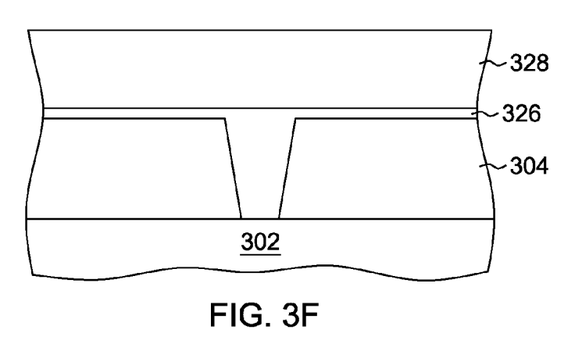
FIG. 3F depicts the structure of FIG. 3E with a masking material layer having been provided over the isolation material, in accordance with one or more aspects of the present invention.

FIG. 3F illustrates the structure of FIG. 3E after depositing a masking material 328 over isolation material 326, in accordance with one or more aspects of the present invention. As used herein, "masking material" refers generally to a material film or a layer which is designed to, in part, protect the isolation material disposed within the fin(s). By way of example, masking material 328 may be or include a nitride material such as, for example, silicon nitride (SiN or $Si_3N_4$) or silicon oxynitride (SiON), which may be deposited using any of a variety of techniques such as, for example, a chemical vapor deposition (CVD), physical vapor deposition (PVD) or plasma-enhanced versions of such processes. Masking material 328 may have any suitable thickness.

Figure 3G:
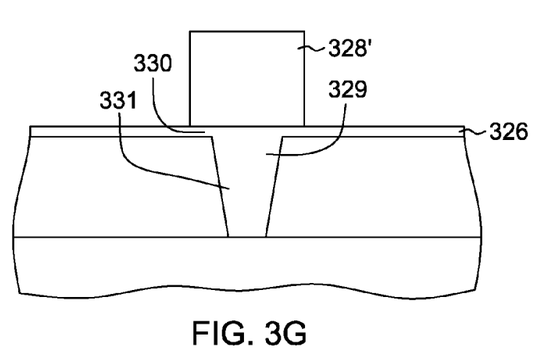
FIG. 3G depicts the structure of FIG. 3F after etching the masking material to facilitate define a protective mask over the isolation material, in accordance with one or more aspects of the present invention.

FIG. 3G illustrates the structure of FIG. 3F after selectively etching through masking material 328 (FIG. 3G) to define a protective mask 328' over isolation region 331 of isolation material 326. Note that, in one embodiment, protective mask 328' may facilitate defining horizontal portion 330 of isolation region 331. By way of example, masking material 328 (FIG. 3G) may be selectively etched or patterned by employing, for instance, any of a variety of lithographic techniques using a combination of one or more masking reticles and a photoresist layer (not shown) disposed over the masking material, which upon exposure to radiation results in defining protective mask 328' over the isolation region of the isolation material 326. In one example, the patterning techniques may include, for instance, utilizing ArF immersion tool with one or more lithographic stacks disposed thereover. In a specific example, the one or more lithographic stacks may include optical dispersive layer, silicon-rich anti-reflective coating layer disposed over the optical dispersive layer and photoresist layer disposed over the anti-reflective coating layer. In another example, the one or more lithographic stacks may include, for instance, one or more protective layers, silicon-rich anti-reflective coating layer disposed over the protective layers and photoresist layer disposed over the anti-reflective coating layer. In one example, the photoresist layer may be or include a chemically amplified positive tone or a negative tone photoresist or an organic-based photoresist, depending on the process parameter employed.

Figure 3H:
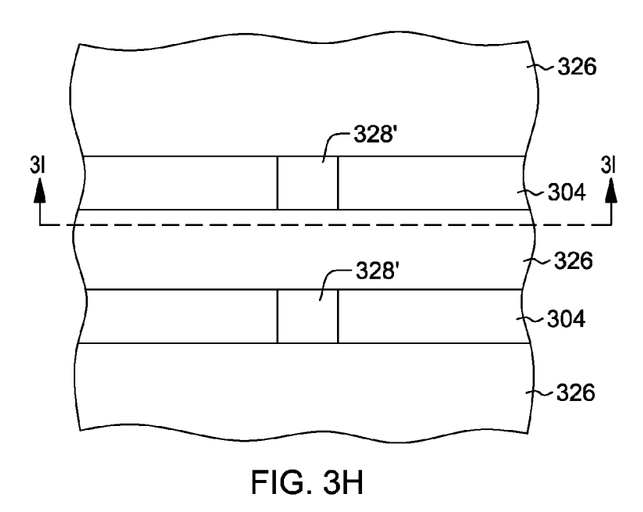
FIG. 3H is a plan-view of the structure of FIG. 3G, after recessing, at least in part, the isolation material over and between the fin structures, in accordance with one or more aspects of the present invention
Figure 3I:
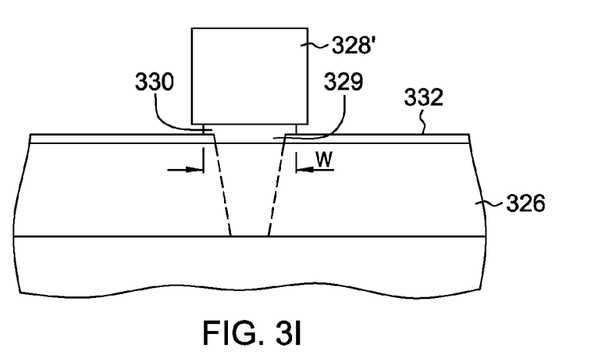
FIG. 3I depicts the structure of FIG. 3H, taken along line 3I-3I thereof, in accordance with one or more aspects of the present invention.

FIG. 3H is a plan-view of the structure of FIG. 3G, after recessing, at least in part, isolation material 326 disposed between the fins, and adjacent to at least one sidewall of fins(s) 304, down from the upper surface(s) of the fin(s). By way of example, the one or more etching processes employed during the recessing of the isolation material may tend to partially undercut protective mask 328' (FIG. 3G) over isolation region 331 (FIG. 3G) of the fin(s). As shown in FIG. 3I, this partially undercutting of protective mask 328' (FIG. 3G) reduces a width of the horizontal portion of isolation region 331 (FIG. 3G. Note that, in one embodiment, isolation material 326 may be recessed down from the upper surface of the fin(s) by selecting a desired etch process so as to facilitate controlling the extent of partial undercutting of the protective mask 328' (FIG. 3G), thereby controlling width "W" of the horizontal portion of the T-shaped isolation region 331.

As noted, FIG. 3I illustrates the structure of FIG. 3H, taken along line 3I-3I thereof and illustrates anisotropic recessing of isolation material 326 (FIG. 3G) disposed between fin(s) 304 and adjacent to at least one sidewall of fin(s) 304 down from an upper surface 332 of the fin(s). In one example, isolation material 326 (FIG. 3G) may be recessed to a height of about 15 to 40% of height of fin(s) 304. In one example, the anisotropic recessing of the isolation material 326 (FIG. 3G) may be accomplished by employing a conventional anisotropic etching process, such as reactive ion etching (RIE) or plasma etching. In one specific example, a directional anisotropic dry etching process such as, for example, reactive ion etching (RIE) may be performed using halogen based chemistry such as, tetrafluoromethane (CFO, sulfur hexafluoride ($SF_6$) or boron chloride ($BCl_3$). In such an example, note that the anisotropic etching of the isolation material may facilitate minimizing the partial undercutting of protective mask 328', thereby facilitating maintaining a width "W" of horizontal portion 330 of the T-shaped isolation region relative to a width of the overlying protective mask 328', as depicted in FIG. 3I.

Figure 3J:
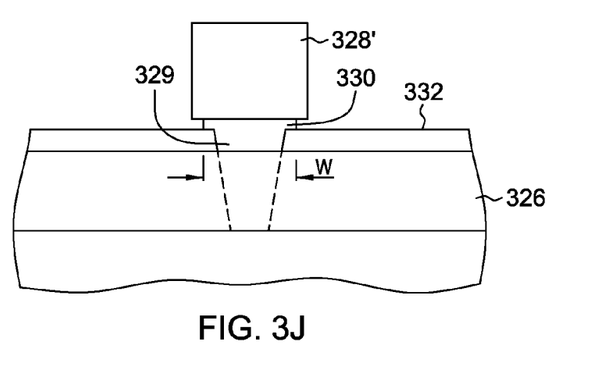
FIG. 3J depicts the structure of FIG. 3H, taken along line 3J-3J thereof, in accordance with one or more aspects of the present invention.

In another example, the recessing of the isolation material 326 (FIG. 3G) adjacent to at least one sidewall of the fin(s) down from the upper surface of the fin(s) may also be accomplished by employing an isotropic wet etching process such as, for example, ammonium hydroxide ($NH_4OH$) as part of, for example a standard clean 1 (SC-1) process. Note that the isotropic etching process is non-directional and therefore the etching may proceed both vertically along the at least one sidewall of the fin(s), and laterally inward to partially undercut the protective mask. In such an example, the isotropic etching of the isolation material may facilitate increasing the partial undercutting of protective mask 328', thereby decreasing a width "W" of horizontal portion 330 of the T-shaped isolation region relative to a width of the overlying protective mask 328', as depicted in FIG. 3J.

Figure 3K:
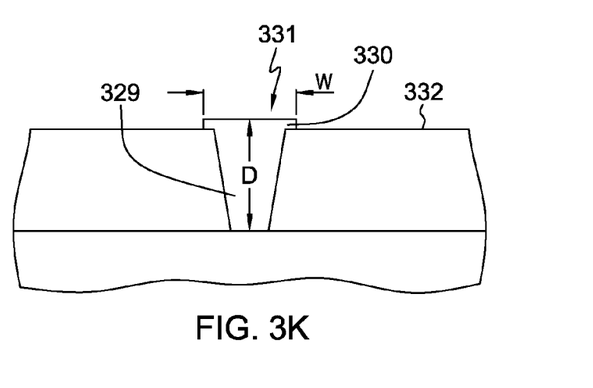
FIG. 3K depicts the structure of FIG. 3I, after removal of the protective mask, in accordance with one or more aspects of the present invention.

FIG. 3K illustrates the structure of FIG. 3I after a non-selective chemical mechanical polish or a non-selective etch-back polish has been performed to remove protective mask 328' (FIG. 3I), using (in one embodiment) horizontal portion 330 of T-shaped isolation region 331 as an etch-back. Note also in FIG. 3K that, the resultant isolation region 331 is T-shaped in elevational cross-section, and that horizontal portion 330 of the T-shaped isolation region extends laterally over vertical portion 329 of the isolation region above the fin. Although as depicted, the isolation region 331 is T-shaped in elevational cross-section, the isolation region may also be formed in other conventional shapes, depending upon the process parameters employed. In one embodiment, depth "D" of vertical portion 329 of the T-shaped isolation region extending into fin(s) 304 is greater than width "W" of horizontal portion 330 of the T-shaped isolation region. Note also, in one embodiment, the vertical portion of T-shaped isolation region tapers into fin(s) 304, and an upper surface of the vertical portion has a width smaller than width "W" of horizontal portion 330 of the T-shaped isolation region. Further, in one embodiment, note that horizontal portion 330 of the T-shaped isolation region resides fully above fin(s) 304. In such an example, the horizontal portion of the T-shaped isolation region advantageously facilitates inhibiting or minimizing undesirable recessing of the fin material during subsequent etching process, thereby facilitating maintaining co-planarity of the upper surfaces of the fin(s) which, in turn, facilitates reducing or minimizing undesirable structural defects during subsequent fabrication processing. Additionally, this T-shaped isolation region 331 disposed within fin(s) 304 advantageously facilitates isolating circuit elements to be fabricated over the fin(s) during subsequent fabrication processing.

Figure 3L:
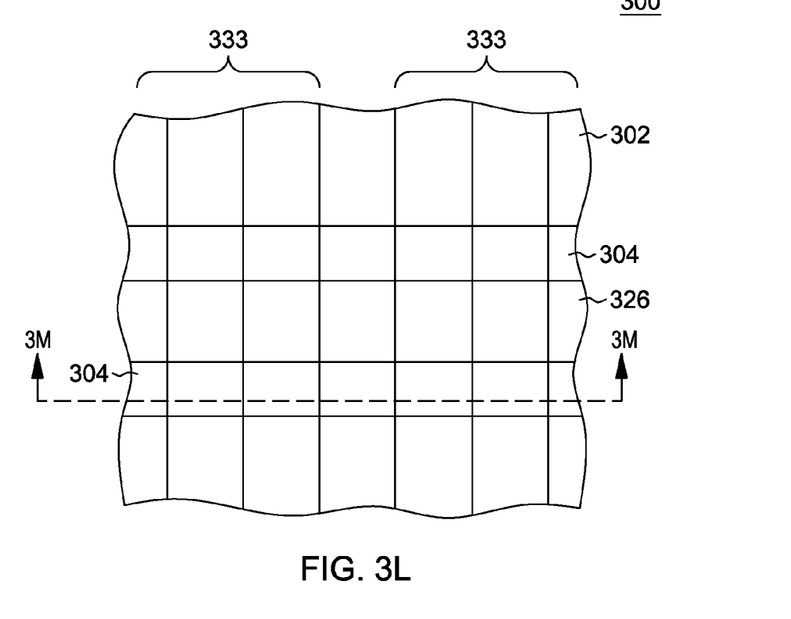
FIG. 3L is a plan view of one embodiment of the structure of FIG. 3K, after fabricating circuit elements associated with the fin structure, in accordance with one or more aspects of the present invention.

FIG. 3L is a plan view of the structure of FIG. 3K after fabricating circuit elements 333 in association with fin(s) 304. By way of overall context, in one example, circuit elements 333 may include gate structures 334 extending conformally over (and partially wrapping around fin(s) 304) and active regions such as, source and drain regions, and channel regions separated by the source and drain regions. Circuit elements 333 associated with the fin(s), may be isolated from one another, in part, via respective T-shaped isolation regions (not shown) disposed within the fin(s), and disposing a sacrificial gate structure 342 over the T-shaped isolation region(s).

Figure 3M:
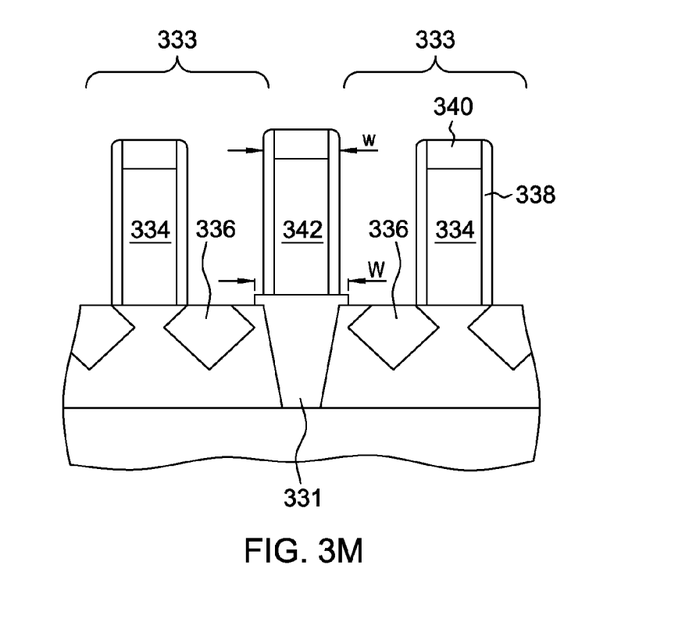
FIG. 3M depicts the structure of FIG. 3L, taken along line 3M-3M thereof, in accordance with one or more aspects of the present invention.

FIG. 3M illustrates the structure of FIG. 3L, taken along line 3M-3M thereof. Note that as discussed above, circuit elements 333 are isolated from one another by the T-shaped isolation region disposed within the fin(s). Circuit elements 333 may include gate structures 334 extending conformally over fin(s) 304. In one example, a replacement gate process may be employed, where a sacrificial gate of an appropriate material, such as polycrystalline silicon (or polysilicon), may be provided at an early stage of circuit fabrication, and then later removed and replaced with a final gate structure. In another example, the gate structure may be formed directly without use of a sacrificial gate. In either gate process, the gate structure may be formed either before (gate-first) or after (gate-last) the formation of a source and drain regions (referred to herein as active regions 336) of field-effect transistors, depending upon the process flow selected. Additionally, the gate structures of circuit elements 333 may optionally be provided with sidewall spacers 338 disposed along the sidewalls of the gate structure and gate caps 340 over the gate material. By way of example, sidewall spacers 338 and gate caps 340 may include or be fabricated of a nitride material such as, for example, silicon nitride (SiN). Further, active regions 336 may be formed using any suitable techniques including, for example, ion implantation, epitaxial growth of embedded source/drain materials and activation anneals, etc.

Note that, as depicted and described above, in this embodiment, the horizontal portion of the T-shaped isolation region residing fully above the fin(s) advantageously facilitates protecting the fin material, in particular, along and below the horizontal portion of the T-shaped isolation region, thereby minimizing or inhibiting excessive recessing of the fin material during subsequent fabrication processing. This, in turn, advantageously facilitates uniform epitaxial growth of embedded source/drain materials which, in turn, could improve the circuit performance by increasing the mobility of charge carriers of the resultant device(s). Note that, as depicted, the positioning of the T-shaped isolation region 331 residing fully above within fin(s) 304 results in increasing the positioning of the sacrificial gate structure relative to the gate structures of the circuit elements, thereby advantageously facilitates isolating circuit elements 333 from one another as well as minimizing undesirable junction leakage current of the resultant semiconductor structure. In another example, T-shaped isolation region 331 residing fully above the fin(s) could result in decreasing overall size of the sacrificial gate structure relative to the gate structures of the circuit elements which, in turn, could also result in minimizing undesirable junction leakage current as well as facilitating isolation of the circuit elements of the resultant semiconductor structure. Note also that a sacrificial gate structure 342 of an appropriate material, such as polycrystalline silicon (polysilicon) or amorphous silicon (a-Si) may be disposed over T-shaped isolation region 331, resulting in creating a diffusion break between circuit elements 333 disposed within fin(s) 304. Advantageously, this sacrificial gate structure disposed over the T-shaped isolation region may, in one embodiment, have a width "w" smaller than the width "W" of the T-shaped isolation region which, for instance, facilitates preventing or inhibiting undesirable electrical shorting between the circuit elements, while increasing density of circuit elements formed thereover.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   providing an isolation feature within a fin structure extending above a substrate, the providing comprising:
   providing an isolation material disposed, in part, within the fin structure, the isolation material being formed to include a T-shaped isolation region and comprise a first portion extending into the fin structure, and a second portion disposed over the first portion and extending above the fin structure; and
   wherein providing the isolation material includes disposing the isolation material within and adjacent to at least one sidewall of the fin structure, and wherein the method further comprises providing a layer of masking material over the isolation material, and selectively etching through the layer of masking material to define a protective mask, the protective mask facilitating defining the second portion of the T-shaped isolation region.

2. The method of claim 1, wherein a depth "D" of the first portion of the T-shaped isolation region extending into the fin structure is greater than a width "W" of the second portion of the T-shaped isolation region extending above the fin structure.

3. The method of claim 1, wherein the second portion of the T-shaped isolation region resides fully above the fin structure.

4. The method of claim 1, wherein the first portion of the T-shaped isolation region tapers into the fin structure, and an upper surface of the first portion has a width smaller than a width "W" of the second portion of the T-shaped isolation region extending above the fin structure.

5. The method of claim 1, further comprising recessing, at least in part, the isolation material adjacent to the at least one sidewall of the fin structure down from an upper surface of the fin structure, wherein the recessing of the isolation material also partially undercuts the protective mask to reduce a width "W" of the second portion of the T-shaped isolation region.

6. The method of claim 5, wherein the recessing of the isolation material employs an etching process to partially undercut the protective mask, the etching process being selected to facilitate controlling the width "W" of the second portion of the T-shaped isolation region underlying the protective mask, and the etching process being at least one of an anisotropic etch process or an isotropic etch process.

7. The method of claim 1, wherein the protective mask over the isolation material comprises a nitride material and is selective to an oxide etching process.

8. The method of claim 1, wherein the protective mask comprises a first material, and the isolation material comprises a second material, the first material and the second material being different materials.

9. The method of claim 8, wherein the first material comprises a nitride material, and the second material comprises an oxide material.

10. The method of claim 1, further comprising fabricating, subsequent to the providing of the T-shaped isolation region, a first circuit element and a second circuit element in association with the fin structure, wherein the T-shaped isolation region disposed partially within the fin structure facilitates isolating the first and second circuit elements.

11. The method of claim 10, further comprising providing a sacrificial gate structure disposed over the T-shaped isolation region.

12. The method of claim 11, wherein a width "w" of the sacrificial gate structure disposed over the T-shaped isolation region is smaller than a width "W" of the second portion of the T-shaped isolation region.

13. A semiconductor device comprising:
   a substrate with a fin structure extending above the substrate;
   a first circuit element and a second circuit element in association with the fin structure;
   a T-shaped isolation region comprising an isolation material disposed partially within the fin structure and separating the first and second circuit elements, the T-shaped isolation region comprising a first portion extending into the fin structure, and a second portion disposed over the first portion and extending above the fin structure;
   said isolation material disposed within and adjacent to at least one sidewall of the fin structure; and
   a protective mask over the isolation material, the protective mask comprising a layer of masking material and defining the second portion of the T-shaped isolation region.

14. The semiconductor device of claim 13, wherein a depth "D" of the first portion of the T-shaped isolation region extending into the fin structure is greater than a width "W" of the second portion of the T-shaped isolation region extending above the fin structure.

15. The semiconductor device of claim 13, wherein an upper surface of the first portion of the T-shaped isolation region is coplanar with an upper surface of the fin structure, and the second portion of the T-shaped isolation region resides fully above the fin structure.

16. The semiconductor device of claim 13, wherein the first portion of the T-shaped isolation region tapers into the fin structure, and an upper surface of the first portion has a width smaller than a width "W" of the second portion of the T-shaped isolation region extending above the fin structure.

17. The semiconductor device of claim 13, further comprising a sacrificial gate structure disposed over the T-shaped isolation region.

18. The semiconductor device of claim 17, wherein a width "w" of the sacrificial gate structure disposed over the T-shaped isolation region is smaller than a width "W" of the second portion of the T-shaped isolation region.

19. The semiconductor device of claim 13, wherein the T-shaped isolation region comprises an oxide material.

* * * * *